United States Patent
Tran

(10) Patent No.: US 6,195,778 B1
(45) Date of Patent: Feb. 27, 2001

(54) DEMODULATION OF DVD CODEWORDS USING DEPENDENCY-SORTED TABLES FOR DUPLICATE/DEPENDENT AND UNIQUE/NON-DEPENDENT MAPPINGS

(75) Inventor: Phuc Thanh Tran, Milpitas, CA (US)

(73) Assignee: LSI Logic Corp., Milpitas, CA (US)

(*) Notice: Subject to any disclaimer, the term of this patent is extended or adjusted under 35 U.S.C. 154(b) by 0 days.

(21) Appl. No.: 09/126,125

(22) Filed: Jul. 30, 1998

(51) Int. Cl.[7] .................................................. H03M 13/00

(52) U.S. Cl. ........................ 714/752; 375/240; 375/340

(58) Field of Search ..................................... 714/752, 759, 714/758, 764, 701, 756, 746; 375/340, 320, 316, 240, 324, 328, 325, 222, 261; 370/529; 369/14, 48, 59; 360/32; 711/211

(56) References Cited

U.S. PATENT DOCUMENTS

| | | | |
|---|---|---|---|
| 5,189,657 | 2/1993 | Lee | 369/59 |
| 5,218,431 | 6/1993 | Gleicher et al. | 348/472 |
| 5,249,289 | 9/1993 | Thamm et al. | 707/7 |
| 5,519,683 | 5/1996 | Mizokami et al. | 369/59 |
| 5,627,844 | 5/1997 | Cho | 714/759 |
| 5,642,304 | 6/1997 | Simpson | 708/446 |
| 5,675,382 | 10/1997 | Bauchspies | 348/390 |
| 5,740,203 | 4/1998 | Ramaswamy et al. | 375/341 |
| 5,761,179 | 6/1998 | Iwasaki et al. | 369/116 |
| 6,002,718 | * 12/1999 | Roth | 375/240 |

OTHER PUBLICATIONS

Stan et al.(Look–Ahead Seek Correction in High–Performance CD–ROM Drives. IEEE, 1998).*

"DVD Demystified", Jim Taylor, McGraw–Hill, 1997, pp. 120–136.

* cited by examiner

Primary Examiner—Albert De Cady
Assistant Examiner—Guy Lamarre
(74) Attorney, Agent, or Firm—Stuart T. Auvinen

(57) ABSTRACT

A demodulator for digital-versatile disk (DVD) optical disks converts 16-bit codewords stored on the disk into 8-bit symbols or user bytes that are sent to the host after error correction. Rather than use the modulation tables in the DVD specification in reverse, the entries in the modulation table are sorted and combined. The four states stored in the DVD modulation table are reduced to two states or conditions. All entries from states 1 and 4 are sorted into unique tables that have unique mappings of codewords to symbols. Since the unique mappings are not sequence or state dependent, no state information is stored in the unique tables. Entries from states 2 and 3 are sorted into duplicates tables that have duplicate mappings, where a codeword can map to two different symbols, depending on the state sequence. One of the two symbols is chosen based on bits in the following codeword, which is the next state. The next state is stored with each entry in the duplicates tables, while all current state information is deleted from all tables. The main modulation table is reduced from 1024 entries to 541 in the main unique and duplicates demodulation tables, while a substitute modulation table is reduced from 348 to 209 entries in the substitute unique and duplicates tables. Table size is reduced by 45%.

20 Claims, 6 Drawing Sheets

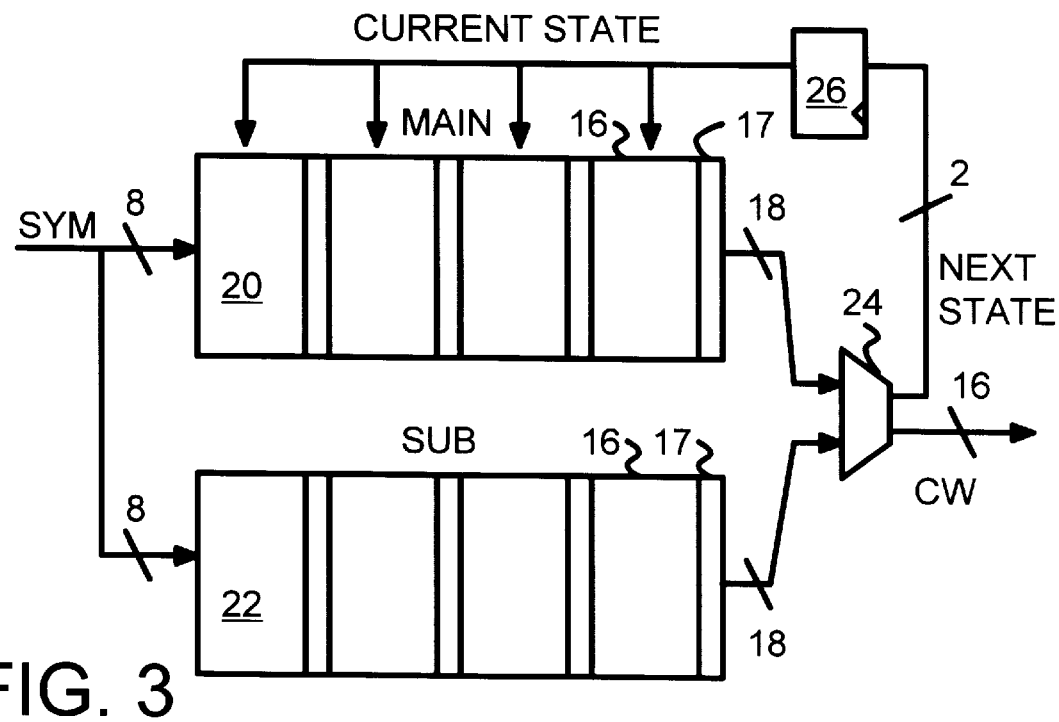
FIG. 3
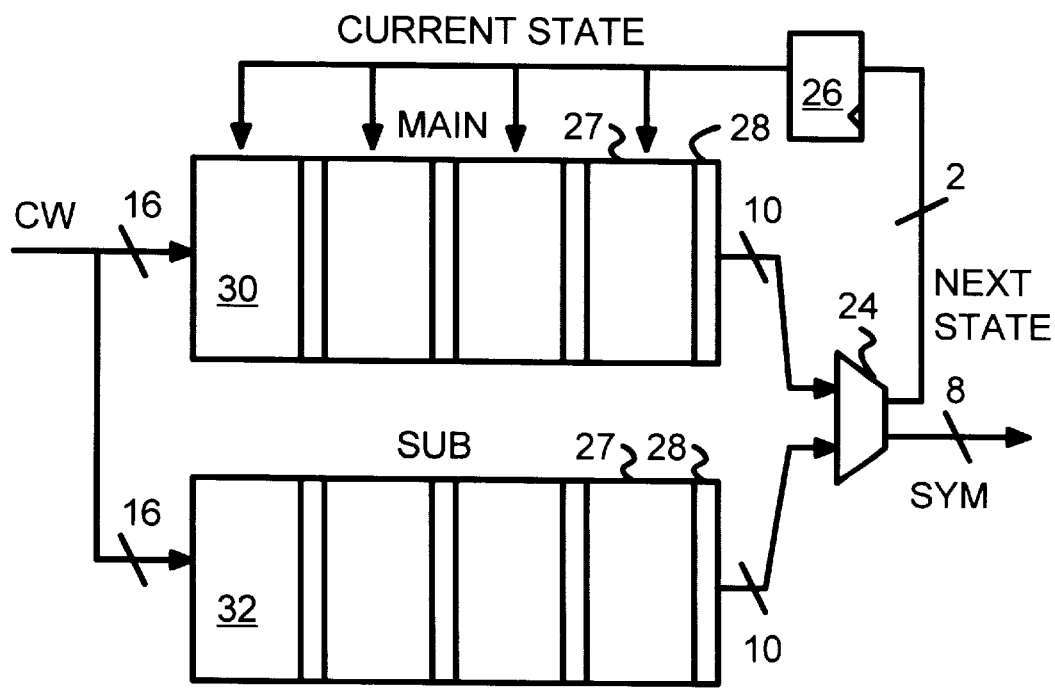
FIG. 4    MAIN: 256 X 4

34↘  PRIOR ART
4: 0010000100100-2   0010000100100-2   1001001000000-4   1001001000000-4
5: 1010000000100-2   0100000100100-1   1010000000100-2   0100000100100-1
6: 1000000000100-4   0010000100100-3   1000000000100-4   1000000000100-4
                          ↑                ↑
                          36               38
FIG. 5
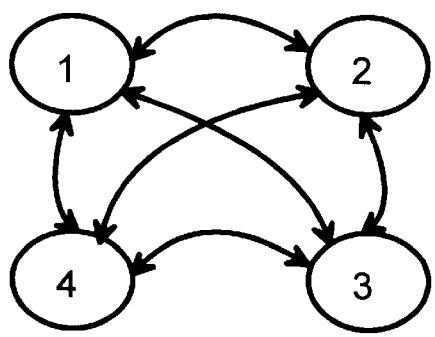
PRIOR ART
FIG. 6
FIG. 7
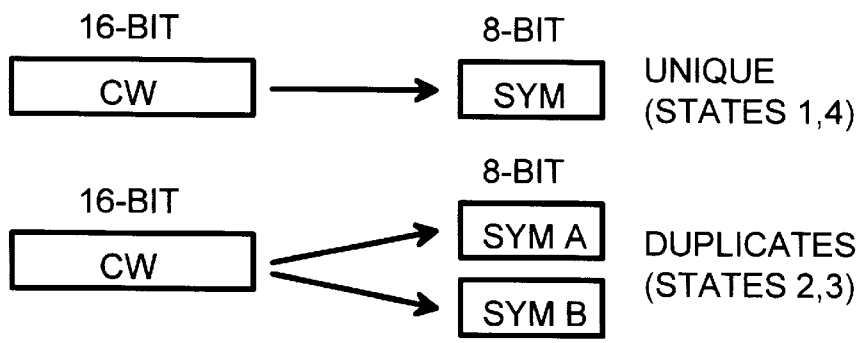
FIG. 8

DEMODULATION OF DVD CODEWORDS USING DEPENDENCY-SORTED TABLES FOR DUPLICATE/DEPENDENT AND UNIQUE/NON-DEPENDENT MAPPINGS

FIELD OF THE INVENTION

This invention relates to optical-disk systems, and more particularly for methods to demodulation of run-length-limited (RLL) coded data.

BACKGROUND OF THE INVENTION

Optical disks such as compact-disks ROMs (CD-ROMs) and digital-versatile disks (DVDs) store data as pits on the surface for CD or between sandwiched layers for DVD. As a laser scans over these pits in a track, light is scattered, reading a zero, while the absence of pits allows the laser to be reflected back to a photo-sensor, which reads a one.

These pits have a minimum length and spacing. The minimum length for DVD is two bits, while the maximum length is 10 bits. A maximum pit length is needed so that a clock signal can be encoded with the data and extracted during playback.

The pits are sequenced so that analog signals reading the disk do not vary significantly form an average voltage. Minimizing voltage excursions allows more precise small-signal electronics to be used for the read pickup. If the read signal tended to sweep in voltage over time, or had a D.C. buildup, then the small-signal electronics could operate away from its bias point and thus operate with less precision.

Modulation information is added to the user data before recording to achieve a zero D.C. bias. For CD-ROMs, each 8-bit user data byte is expanded during modulation to 14 bits to define the physical pits on the disk. DVDs expand each byte to 16 bits. Rather than simply add 6 or 8 bits to each byte, the byte is completely remapped to a 16-bit codeword that may not have any similarity to the data byte. The modulation codes are carefully chosen to minimize low-frequency or D.C. energy, and include characteristics beneficial to synchronization and merging.

The modulation process for CD-ROMs is known as EFM, for eight-to-fourteen modulation, or simply 8/14. DVDs use a new 8/16 modulation process sometimes called "EFM-Plus", since DVD modulation expands eight bits to sixteen, two more bits than for CD. The modulation codes themselves do not appear to follow any discernable pattern, so tables are often used to convert bytes to codewords and back to bytes. These tables can be quite lengthy, since a one-to-one mapping is not used.

FIG. 1 illustrates modulation of data written to a DVD disk and demodulation of data read from the DVD disk. The user's data is known as a symbol. The user data stream includes the user's actual data and overhead bytes such as error-correction codes, headers, identifiers, and checksums.

A symbol byte SYM is converted to a 16-bit codeword CW by 8/16 modulation, and the 16-bit codeword is written to DVD disk 18. The actual writing process may be quite complex, such as writing a pattern of pits to a substrate, then forming a mold from the patterned substrate, and finally using the mold to stamp out thousands of individual DVD disks 18.

When DVD disk 18 is read, the analog signals are processed to generate a bit stream that is divided into 16-bit codewords. Each codeword is converted by 8/16 demodulation back to an 8-bit symbol SYM, the same symbol that was input to the modulation process when the DVD disk was written.

FIG. 2 shows signals read from a DVD disk. The physical pits on the DVD disk are shown in contour 10. As a laser is scanned over contour 10, it is reflected to a photo-sensor when the surface is flat, such as it is initially in FIG. 2, but scattered when each of the two pits are rotated under the laser. The analog signal with waveform 12 is generated by the photo-sensor and amplified. When the laser is over the pits of contour 10, signal 12 is low (little light picked up by the photo-sensor). When the laser is over the flay surface of contour 10, a high signal 12 is generated by the large amount of laser light reflected to the photo-sensor.

A non-return-to-zero-inverted NRZI encoding is used for the disk data so that signal transitions occur frequently enough to encode a clock with the signal. This clock can be recovered with a phase-locked loop (PLL). Once the data is extracted from the clock from signal 12, the return-to-zero RZ binary bitstream 14 is produced. Each edge of a pit creates a binary one, while no transitions, such as in the middle of a pit or the flat surface, create zeros. As can be seen, bitstream 14 contains many zeros and relatively few ones. The modulated codewords likewise have longer runs of zeros with single ones when the pits transition to the surface.

Modulation Tables—FIG. 3

FIG. 3 shows that the modulation tables in the DVD specification can be used to generate 16-bit codewords from symbol bytes. The DVD specification is available from Toshiba Corp. and includes tables that define the 8/16 modulation standard for DVD. The specification includes two tables: a main table 20 and a substitute table 22. Both tables are indexed by the 8-bit symbol. While the main table 20 has one line for each of the 256 possible symbols, substitute table 22 contains only 87 lines.

Each table 20, 22 is further divided into four sub-tables. One of the four sub-tables is chosen based on a current state: states 1, 2, 3, or 4. For example, when the current state is 2, the second of the four subtables is chosen and the other three subtables are ignored.

Each line contains one codeword entry in each of the four subtables, one codeword for each of the four states. Thus a symbol input for modulation selects one of the 256 lines of main table 20. This line has four codewords: one of the codewords is selected based on the current state from flip-flop 26. For some symbols, a matching line exists in substitute table 22 as well as main table 20. When substitute table 22 contains a line for the symbol, it also has one of the four codewords in the line selected by the current state from flip-flop 26.

The codeword from main table 20 and the codeword from substitute table 22 are input to multiplexer or mux 24, and one of the two codewords is selected and output as the 16-bit codeword. The codeword entry from either the main or the substitute table can be chosen, based on the entry than minimizes the absolute value of a running digital sum value (DSV). The DSV is incremented for each 1 and decremented for each 0 in a codeword. Alternately, the substitute entry can be used when the DSV exceeds a threshold. Minimizing the running DSV minimizes voltage excursions of the read signal and thus improves read accuracy.

A four-state machine is apparently used during modulation, but the rules for sequencing among the four states when demodulating are not given in the DVD spec, nor is any pattern apparent from the tables. Instead, each codeword entry 16 in the tables has a next state field 17 appended. The next state is stored as a 2-bit field and output with the selected 16-bit codewords from tables 20, 22. Mux 24 selects the next state and codeword and sends the 2 next-state bits for storage in flip-flop 26. The next state stored in flip-flop 26 is used as the current state for the next symbol lookup.

De-Modulation Tables—FIG. 4

The DVD spec provides no separate tables for demodulation. Instead, the modulation tables can be used in reverse. FIG. 4 shows how demodulation can be performed using the modulation tables in the DVD spec.

An exhaustive table of $2^{16}$ lines, (64K lines) could be used for the reverse tables for demodulation, using the 16-bit codeword as the index. However, since a run-length-limited code is used for the codewords, most possible combinations of the 16K possible binary combinations are not used. A smaller reverse table using just the entries in the modulation tables is more economical.

The entries in the modulation tables can be ordered by codeword and an associative lookup performed for matching codewords. The demodulation tables act as an associative-mapped cache. The entries are still segregated into subtables by the next state, and into the main and substitute tables. The entries in main demodulation table 30 and substitute demodulation table 32 each contain a codeword, the symbol mapping to the codeword according to the modulation tables, and the next state from the modulation tables. The codeword, symbol pair is stored in 16-bit field 27, while the 2-bit next state is stored in the following codeword that comes from the state indicated in field 28.

When a 16-bit codeword is looked up, one of the four subtables is selected by the current state from flip-flop 26. An associative search of all entries in the selected subtable for both tables 30, 32 is made for matching codewords. When a match is found, the symbol paired with the codeword and the next state are output. Mux 24 selects the symbol and next state from either main demodulation table 30 or substitute demodulation table 32. A codeword appears in either the main or the substitute tables, but never appears in both. However, the same codeword can appear in several subtables and the correct subtable must be chosen by the current state. The 8-bit symbol from the selected table and subtable is output by mux 24 while the 2-bit next state is latched into flip-flop 26.

While such demodulation tables constructed by reversing the modulation tables in the DVD specification are feasible, the size of the tables is rather large. The main subtables each contain 256 entries, while the substitute subtables each contain 87 entries. A total of 4×256, plus 4×87, or 1372 entries are needed. The large size of the tables can slow down lookup access, reducing the performance of the demodulator. The large size also restricts implementation in logic gates using a hardware-design language such as VHDL.

Smaller demodulation tables are desired. A faster de-modulation process is desired. Compaction of the modulation tables to reduce the number of entries is desired, but without losing accuracy and precision of the conversion. A more streamlined de-modulation of DVD-disk data is sought. It is desired to reduce dependencies of codewords to other codewords in the data stream. It is desired to reduce the state-sequencing information that is stored in the current modulation tables. It is desired to perform demodulation without state dependency.

SUMMARY OF THE INVENTION

A demodulator has a codeword input that receives codewords modulated using a multi-state modulator from original symbols. A symbol output is for outputting demodulated symbols converted from the codewords. The demodulated symbols match the original symbols when no errors occur. A unique detector is coupled to the codeword input. It determines when an input codeword has a unique mapping to a single symbol in which the input codeword is only converted to the single symbol regardless of a state of the multi-state modulator. The unique detector outputs the single symbol as a demodulated symbol to the symbol output.

A duplicates detector is coupled to the codeword input. It determines when the input codeword has a non-unique mapping to a plurality of symbols. The input codeword is converted to a first symbol when the multi-state modulator was in a first state, but is converted to a second symbol when the multi-state modulator was in a second state after generating the input codeword. The duplicates detector outputs the first symbol and the second symbol.

A next-codeword decoder is coupled to receive from the codeword input a next codeword that follows the input codeword. The next-codeword decoder reads bits of the next codeword to determine a modulation state. A multiplexer is coupled to the next-codeword detector and receives the first symbol and the second symbol from the duplicates detector. It outputs the first symbol as the demodulated symbol to the symbol output when the modulation state from the next-codeword detector is in a first modulation state, but it outputs the second symbol as the demodulated symbol to the symbol output when the modulation state from the next-codeword detector is in a second modulation state. Thus codewords are demodulated by detecting when the codeword has the unique mapping or the non-unique mapping.

In further aspects the next codeword is in the first modulation state when the multi-state modulator was in the first state when generating the next codeword. The next codeword is in the second modulation state when the multi-state modulator was in the second state when generating the next codeword.

In other aspects the unique detector has a unique table containing unique entries. The unique entries have a codeword field and a symbol field. The unique detector compares the input codeword to the codeword field and selects the symbol field when the codeword field matches the input codeword. The symbol field is output as the demodulated symbol. Thus a table lookup is performed to find the demodulated symbol for the unique mapping.

In further aspects the duplicates detector is activated when the unique detector fails to find an entry with a matching codeword. The duplicates detector has a duplicates table containing duplicates entries. The duplicates entries having a codeword field, a symbol field, and a next-state field. The duplicates detector compares the input codeword to the codeword field and selects the symbol field when the codeword field matches the input codeword. The symbol field is output as the first symbol when the next-state field indicates the first modulation state, but the symbol field is output as the second symbol when the next-state field indicates the second modulation state. Thus the duplicates table includes next-state information but the unique table contains no state information.

In other aspects two entries match the input codeword in the duplicates table, but only one entry can match the input codeword in the unique table. Entries in the unique table have no dependency to other codewords in an input stream of codewords from the codeword input, but entries in the duplicates table are dependent on the next codeword in the input stream of codewords from the codeword input. Thus entries are sorted by dependency.

BRIEF DESCRIPTION OF THE DRAWINGS

FIG. 3 shows that the modulation tables in the DVD specification can be used to generate 16-bit codewords from symbol bytes.

FIG. 4 shows how demodulation can be performed using the modulation tables in the DVD spec.

FIG. 5 is a 3-line sample of a full-sized modulation table with state information.

FIG. 6 shows a four-state state machine that the DVD specification uses for modulation tables.

FIG. 7 shows a reduced 2-state state machine for demodulation.

FIG. 8 highlights that demodulation exhibits two types of behavior—unique and duplicate mappings.

DETAILED DESCRIPTION

Figure 1:
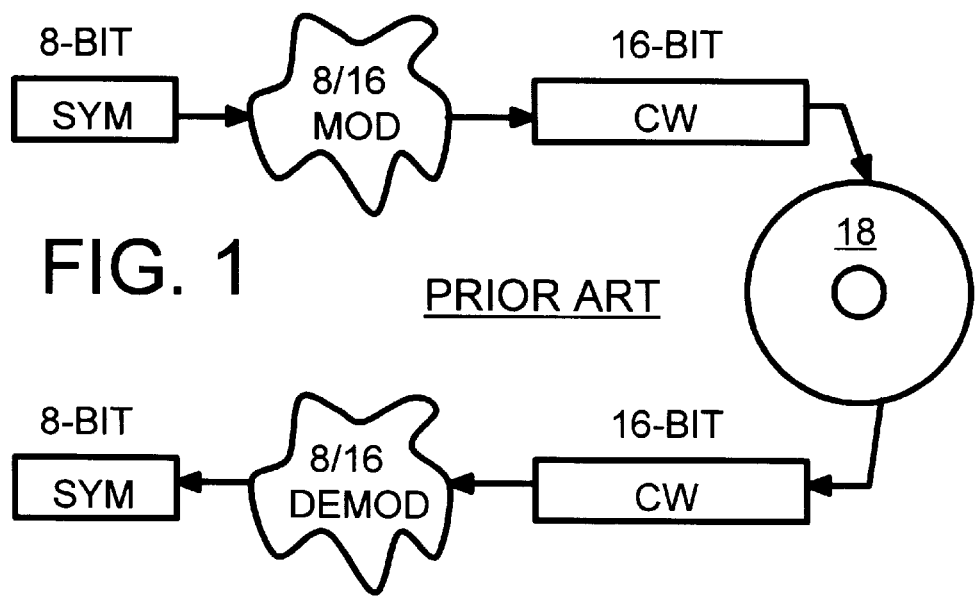
FIG. 1 illustrates modulation of data written to a DVD disk and demodulation of data read from the DVD disk.
Figure 2:
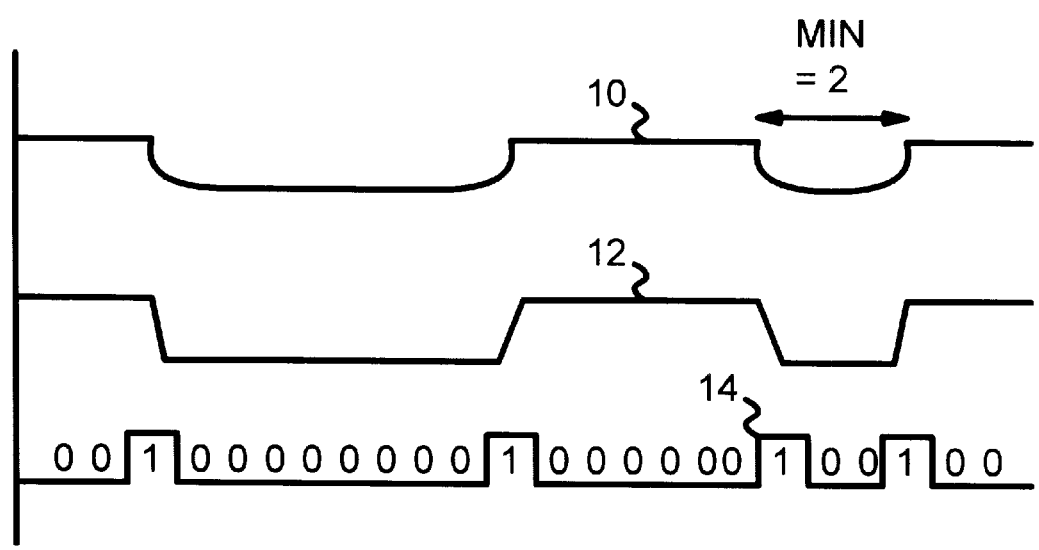
FIG. 2 shows signals read from a DVD disk.

The present invention relates to an improvement in DVD demodulation. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has carefully examined the modulation tables in the DVD spec to try to discern any patterns that could be used to simplify the reverse tables for demodulation. The inventor has discovered that many lines in the modulation table have entries repeated for different current states for the same line (symbol). Thus some entries have the same (codeword, symbol) pairings. These repeated entries also have the same next state and thus can be combined.

Two or more codewords can map to the same symbol in either case, but for demodulation this is not problematic. Separate entries exist for each (codeword, symbol) pair.

Some codewords do not map to a single symbol. Instead, the codeword maps to two different symbols. Only the states differ. Other codewords have a direct mapping to a symbol. These codewords always map to the same symbol, regardless of the state.

The inventor has realized that the state information can be removed for these mappings, since the (codeword, symbol) pair always maps to the same symbol, regardless of state. State information is only needed when a codeword can map to 2 different symbols. In this respect, de-modulation can be simplified compared with modulation.

Example of Using Prior-Art Modulation Tables—FIG. 5

FIG. 5 is a 3-line sample of a full-sized modulation table with state information. This table is similar to the main or substitute modulation tables in the DVD specification, but the number of bits in the codewords are reduced for illustrative purposes.

Each row or line in the table is a set of mappings for one symbol. The symbols (user bytes) 4, 5, and 6 are shown in FIG. 5. The actual main table has 256 rows, for symbols 0 to 255. Each column in the table is a 3-line portion of the subtable. There are four columns and four subtables. A total of 3×4 or 12 entries are shown.

Entry 34 is a (codeword, symbol) pair of a codeword that maps to symbol 4 (00000100 binary). When codeword 0010000100100 is received from the DVD disk, it is looked up in the table by scanning all entries in the column (suitable) for the current state. When the current state is 1, the first column is scanned, and entry 34 is found as a matching entry. The table then outputs the symbol 4, since the matching entry was in line 4 of the table.

Entry 34 also contains the next state, indicated by the "−2" appended to the codeword. This means that the next state is state 2. This next state from entry 34 is also read out of the table and stored in a flip-flop.

When the next codeword in the data stream from the DVD disk is received, it is looked up in column 2, because the current state is now 2 (latched from entry 34 for the last codeword). Assume that this next codeword is also 0010000100100, the same codeword as before. A matching entry is found in column 2 (subtable 2) in the third line, entry 36. Since entry 36 is in the line for symbol 6, the demodulator outputs symbol 6 (00000110 binary) as the next user byte.

Notice that the same codeword 0010000100100 sent twice is converted to two different symbols—first 4, and then 6. Thus the data-stream sequence 0010000100100, 0010000100100 is converted or demodulated to 4, 6. The same codeword mapping to two different symbols is evidence of the sequence-dependency of demodulation.

The next state from entry 36 is "−3", or state 3. For the next codeword (third in this example), the third column (subtable 3) is used for lookup. The third codeword in this example is 10000000000100, which is associatively-searched in column 3 since the next state for the previous codeword was 3. Entry 38 matches the input codeword, and the symbol output is 4 (matching entry in line 4). The next state is "−4", state 4.

State Patterns in Modulation Table

Several patterns are seen in the example table of FIG. 5. These patterns have been noted by the inventor in the actual tables from the DVD specification and are shown in the example table for highlighting the patterns that the inventor has discovered.

Codeword 0010000100100 is mapped to two different symbols, as can be seen by entries 34, 36, which map to symbols 4 and 6. This symbol is repeated in line 4 for columns 1 and 2, but always has a next state of 2 in line 4. The same symbol in line 6 appears only in column 2, but has a next state of 3. The next-state-2 entry 1010000000100 in line 5 has another entry (not shown) with the same codeword 1010000000100 but a next-state of 3. This other entry is in one of the other lines of the table other than the 3 lines shown in the example.

The inventor has discovered the next-states 2 and 3 are always associated with duplicate mappings, where one codeword can be converted to two different symbols, depending on the sequence (state). When examining the main table, it is seen that entries with next-states of 2 and 3 have duplicate mappings, with the same codeword mapping to one symbol when the next state is 2, but mapping to a different symbol when the next state is 3.

Further exhaustive examination of the full main table shows that states 1 and 4 are always unique mappings—a codeword maps to only one symbol. The example of FIG. 5 shows that line 4 columns 3 and 4 have a codeword that maps to symbol 4 with the next state of 4. This codeword 1001001000000 appears nowhere else in the main or substitute tables, only in line 4. Even though the codeword is repeated, it is only repeated on the same line, mapping to the same symbol with the same next-state. The same is true for line 5, columns 2 and 4, with a codeword that has a next state of 1, and line 6, columns 1, 3, 4 that has a codeword with a next state of 4.

Thus the inventor has determined that when the next state is 1 or 4, the codeword maps to one and only one symbol. It is a unique mapping. When the next state is 2 or 3, the same codeword can map to two different symbols. When the next-state is 2, the codeword maps to a first symbol, but when the next state is 3, the codeword maps to a second symbol. This is a duplicate, non-unique mapping.

State Machine Reduced From 4 to 2 States—FIGS. 6, 7

FIG. 6 shows a four-state state machine that the DVD specification uses for modulation tables. The rules for sequencing among the four states are not given in the DVD specification. Instead, the next state is determined by a lookup in the modulation tables, and the choice of main or substitute tables. The modulation tables store a 2-bit next-state variable with each codeword entry.

FIG. 7 shows a reduced 2-state state machine for demodulation. The inventor has realized that only two possibilities exist—that the demodulation mappings are unique or duplicate. States 1 and 4 are always preceded by a unique mapping, while states 2 and 3 are always preceded by a duplicate mapping. Thus states 1 and 4 can be combined into a single state, shown as 1,4 in FIG. 7. States 2 and 3 are combined into a single state 2,3. Thus the inventor contemplates a simplified state machine having only 2 states. This is quite simpler than the four-state state machine of FIG. 6.

Next-State Information Not Stored in Tables for States 1,4

The inventor has further realized that states 1 and 4 have no dependency to other codewords, and thus state 1,4 can be eliminated. States 1 and 4 do not require sequential logic such as a state machine for demodulation. State information does not have to be stored in the demodulation tables for entries with states 1 and 4. This reduces all state 1 and 4 entries by the 2-bit next state field, which is removed.

States 2 and 3 do have a dependency, but this dependency can be resolved without using running state machine. Thus no state machine is needed. The state information for states 2 and 3 is still stored with these entries, but the next-state field can be reduced to one bit, since the only possible next-state are 2 and 3.

Unique and Duplicate Demodulation—FIG. 8

FIG. 8 highlights that demodulation exhibits two types of behavior—unique and duplicate mappings. A unique mapping occurs when a 16-bit codeword can be demodulated to one and only one 8-bit symbol. This unique mapping occurs for states 1 and 4. The unique mapping occurs in a single line in either the main or the substitute tables, but not in both tables.

A duplicate mapping occurs when a 16-bit codeword maps to two different 8-bit symbols. Symbol A is chosen when the next-state is 2, but symbol B is chosen when the next-state is 3. The current state is irrelevant. Only the next-state determines the symbol chosen. Thus there is no dependency to the previous codeword in the data stream. The only dependency is to the next codeword in the data stream. Also, the next codeword can have any value; it does not depend on the previous codeword that has a dependency to it. Dependency is only one way, not two-way.

Figure 9:
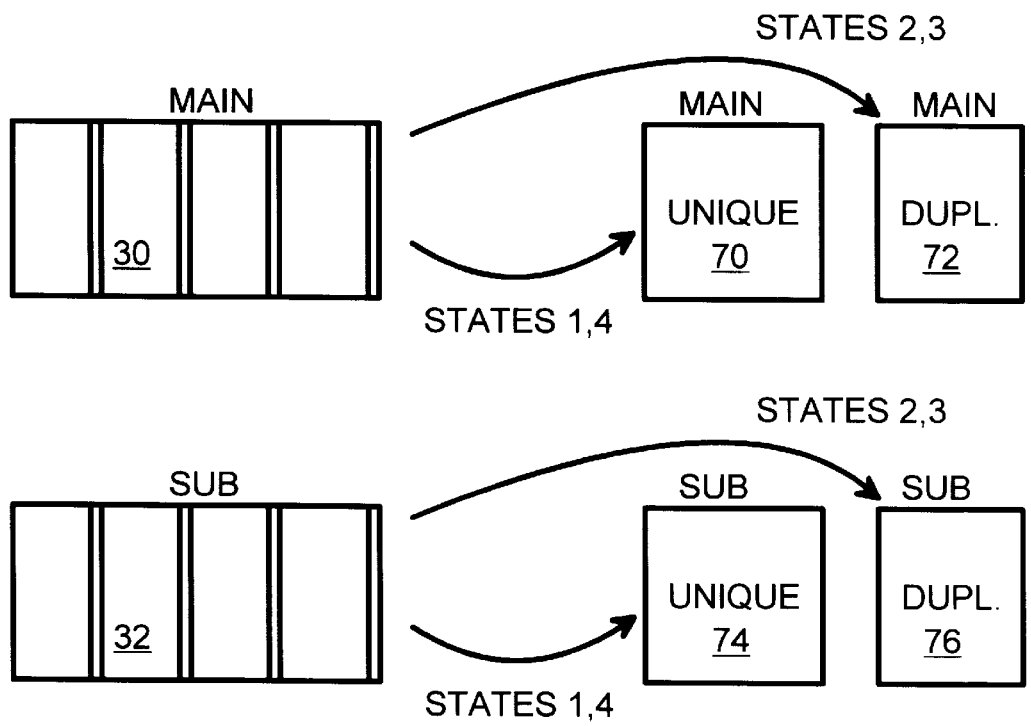
FIG. 9 shows that the inventor sorts the entries from the main demodulation table 20 into a main unique table 70 and a main duplicates table 72.

Unique and Duplicate Entries Sorted into Reduced Tables—FIG. 9

Duplicate mappings occur for states 2 and 3, while unique mappings occur for states 1 and 4. The next-state information is only needed to resolve among two possible symbols for states 2 and 3. The inventor has realized that the demodulation entries can be segregated into unique (state 1 and 4) and duplicate (state 2 and 3) entries, and stored separately. The next-state field is removed from the table with unique entries, but kept as a 1-bit field for the table with the duplicate entries.

FIG. 9 shows that the inventor sorts the entries from the main demodulation table 20 into a main unique table 70 and a main duplicates table 72. All entries from main demodulation table 30 that have a next state of 1 or 4 are sorted into main unique table 70, while entries that have a next state of 2 or 3 are sorted into main duplicates table 72. All entries from main demodulation table 30 are sorted into either table 70 or 72.

Substitute demodulation table 32 is likewise sorted by next state. All entries from substitute demodulation table 32 with a next state of 1 or 4 are sorted into substitute unique table 74, while entries with a next state of 2 or 3 are sorted into substitute duplicates table 76. All entries from substitute demodulation table 32 are sorted into either table 74 or 76.

Current-State Information Eliminated

The next-state fields are removed from main unique table 70 and from substitute unique table 74. Also, the current-state information is removed from all tables, since entries from all four subtables (columns) are combined into a single column in main unique table 70 or substitute unique table 74, and for main duplicates table 72 and substitute duplicates table 76.

Repeated entries in the same line but in different columns in main or substitute demodulation tables 30, 32 are combined together. Thus the number of entries in tables 70, 72, 74, 76 is reduced. Eliminating the current state (sorting into columns or subtables) is what allows repeated entries to be combined into a single entry. In a sense, the prior-art modulation tables have been squeezed from four columns into one column.

Figure 10:
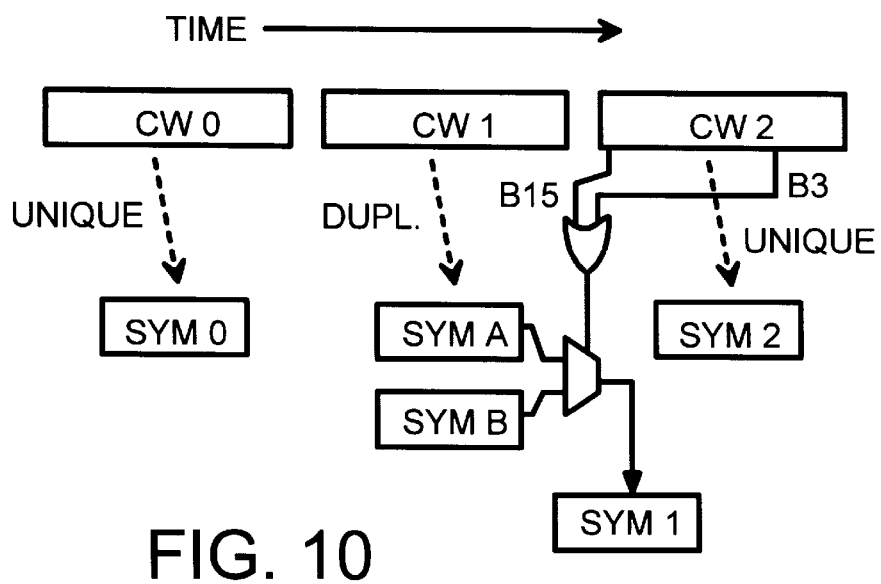
FIG. 10 illustrates how symbol-mapping dependency is resolved using the next codeword.

Dependency on Next-State Extracted from Next Codeword—FIG. 10

FIG. 10 illustrates how symbol-mapping dependency is resolved using the next codeword. A sequence of codewords are read from a DVD disk in the order CW0, CW1, CW2. The first codeword CW0 is looked up in the demodulation tables and a match found in either the main or substitute unique table. Since CW0 has a unique mapping, CW0 is replaced by the symbol from the matching entry in the unique table, SYM0.

The second codeword, CW1, has no match in the unique tables, but matches are found in either the main or substitute duplicates tables. The lookup of codeword CW1 outputs two possible symbols from the tables—symbol SYM A and SYM B. Two matching pairings are found: (CW1, SYM A) and (CW1, SYM B). It is not known from codeword CW1 which of the two symbols is the correct symbol that generated codeword CW1 during modulation. The two symbols SYM A and SYM B are latched until it can be determined which is the correct symbol during the next cycle.

In the next cycle the third codeword, CW2, is received by the demodulator. The codeword CW2 is looked up in the tables, and a matching entry found in the main or substitute unique table. The matching entry has the pairing (CW2, SYM2), and thus symbol SYM2 is output to replace codeword CW2 in the data stream sent to the error corrector and host buffer.

Once codeword CW2 is received, it can be used to resolve the symbol for the previous codeword, CW1. The DVD specification indicates that bits 15 and 3 of a codeword indicate if that codeword is for state 2 or state 3. When both bits 15 and 3 of a codeword are one, then the state is state 3; otherwise the state is state 2. Note that the OR of bits 15 and 3 gives the current state of the codeword, which is the next state of the previous codeword. This is not true for states 1 and 4, but only for states 2 and 3.

Bits 15 and 3 of codeword CW2 are OR'ed together and used to select one of the two symbols from the lookup of the previous codeword CW1. The selected symbol is the correct mapping of the codeword, SYM1.

In the example of FIG. 10, assume that symbol SYM A has a next state of 2 while symbol SYM B has a next state of 3. These two symbols are latched until the next codeword, CW2 is received. Bits 15 and 3 of codeword CW2 are OR'ed. When both bits are one, the OR is true and the state of CW2 is 3, so SYM B is chosen and output as SYM1 since it has a next state of 3. Otherwise the OR is false, and the state of CW2 is 2, so SYM A is chosen and output as SYM1 since it has a next state of 2.

Codeword CW2 having a state of 2 or 3 means that during modulation, its entry in the modulation table was found in columns 2 or 3. The next state of codeword CW is 1 or 4, since it is a unique mapping. Many other sequences are possible, and an example can be devised where codeword CW2 has a duplicate rather than a unique mapping. In that case, codeword CW2 is not resolved until the next codeword (CW4, not shown) is received. Codeword CW1 is still resolved when codeword CW2 is received regardless of the unique/duplicate mapping of CW2.

Figure 11:
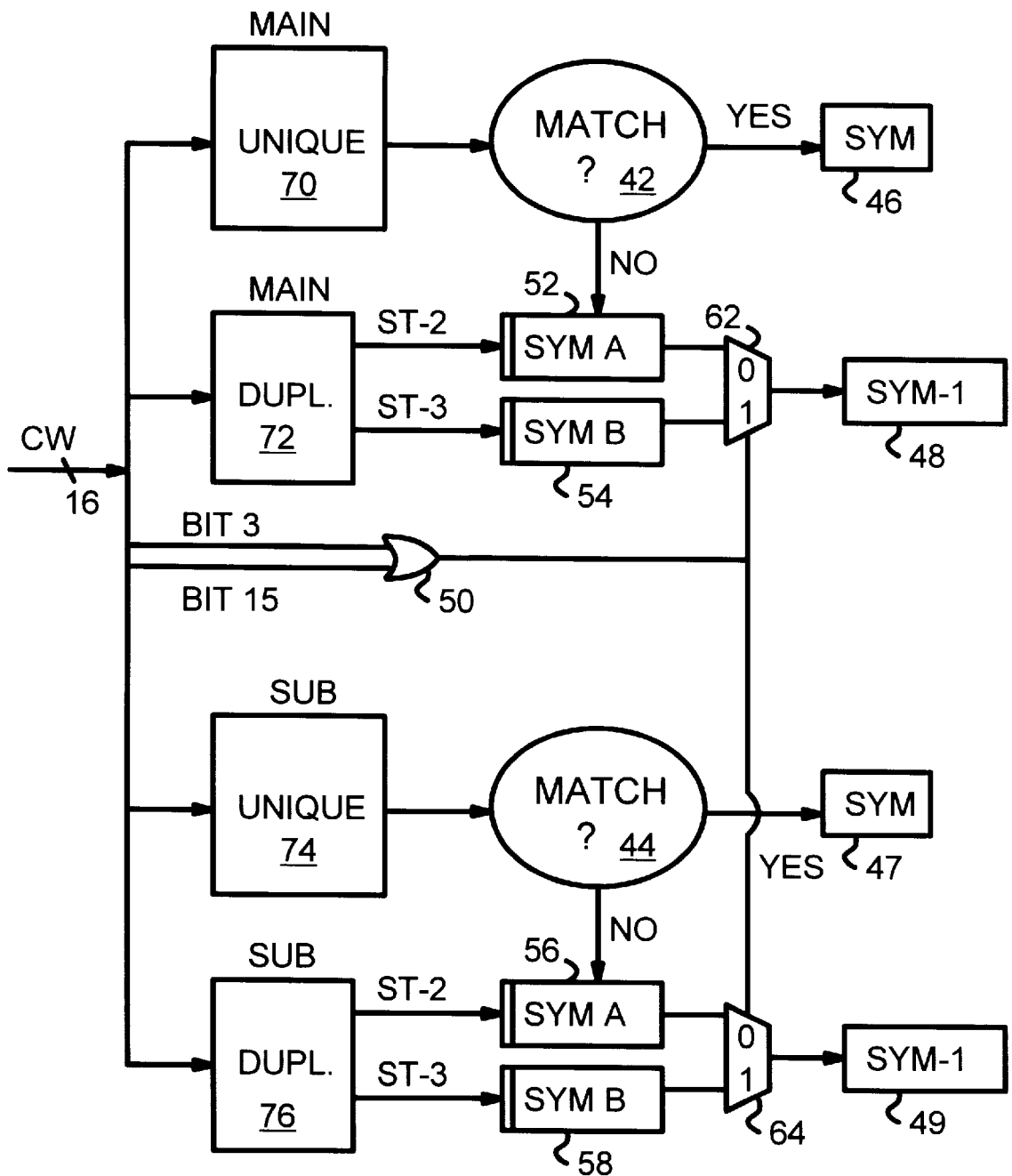
FIG. 11 is a diagram of a demodulator using unique and duplicate lookup tables with a duplicate-symbol dependency-resolver.

Demodulator with Unique and Duplicate Tables—FIG. 11

FIG. 11 is a diagram of a demodulator using unique and duplicate lookup tables with a duplicate-symbol dependency-resolver. A 16-bit codeword is input to the demodulator to be converted to an 8-bit symbol. The codeword is input to each of four demodulation tables:
1. main unique table 70
2. main duplicates table 72
3. substitute unique table 74
4. substitute duplicates table 76.

An associative lookup is performed in each table, comparing the codeword input to codeword indexes in each entry until a match is found. Alternately, the codeword can be used as an index into each table, selecting at most one entry in the unique tables, or two entries in the duplicates tables that are later resolved to a single entry using bits of the next codeword. When comparator 42 finds an entry in main unique table 70 that matches the codeword input, the symbol stored in the entry with the matching codeword is latched in latch 46 as the converted symbol SYM. This symbol is used in place of the codeword in the data stream to the DVD buffer and host.

Sometimes a matching entry is not found in main unique table 70. Instead, comparator 44 finds an entry in substitute unique table 74 that matches the codeword input. The symbol stored in the entry in table 74 with the matching codeword is then latched into latch 47 as the converted symbol SYM.

While no more than one entry in either of unique tables 70, 74 can match any codeword, two entries can match a codeword in duplicates tables 72, 76. When comparators 42, 44 find no match in the unique tables 70, 74, then duplicates tables 72, 76 are looked up. These tables 72, 74 can be looked up in parallel with unique tables 70, 72 to save time, and their outputs disregarded when comparators 42, 44 find a match in the unique tables.

Two matching entries from main duplicates table 72 are latched into registers 52, 54 when comparators 42, 44 fail to find a match in unique tables 70, 72. Register 52 holds SYM A, the symbol when the next state is 2, while register 54 holds SYM B, the symbol when the next state is state 3. Likewise, two entries matching the codeword input in substitute duplicates table 74 are latched into registers 56, 58 when comparators 42, 44 fail to find a match in unique tables 70, 72. Register 56 holds SYM A, the symbol when the next state is 2, while register 58 holds SYM B, the symbol when the next state is state 3.

Only one of duplicates tables 74, 76 has the two matching entries, so only registers 52, 54, or registers 56, 58 hold the valid data. Control logic (not shown) enables registers 52, 54 when main duplicates table 72 and none of the other tables has a match, or enables registers 56, 58 when substitute duplicates table 76 and none of the other tables has a match.

When the next codeword arrives and is being looked up in tables 70, 72, 74, 76, bits 3 and 15 from the next codeword are sent to OR gate 50. The OR of bits 3, 15 from OR gate 50 controls muxes 62, 64 to resolve the symbols from the last lookup. When both bits 3 and 15 are ones, OR gate 50 outputs a one, which causes muxes 62, 64 to select their bottom inputs, from SYM B registers 54, 58. In this case the next state was state 3. Otherwise, OR gate 50 outputs a zero, and muxes 62, 64 to select their upper inputs, from SYM A registers 52, 56. In this case the next state was state 2.

When main duplicates table 72 and none of the other tables has a match, SYM A or SYM B selected by mux 62 is latched into register 48 as the symbol for the last codeword, SYM-1. Otherwise, when substitute duplicates table 76 and none of the other tables has a match, SYM A or SYM B selected by mux 64 is latched into register 49 as the symbol for the last codeword, SYM-1.

The entries in main unique table 70 and substitute unique table 74 can consist of codeword, symbol pairs: (codeword, symbol). The input codeword CW is compared to each of the codeword fields of all entries in the tables to look for a match, or some or all of the bits of the input codeword are used as an index to select one entry or a subset of entries in the table for comparison.

The entries in duplicates tables 72, 76 can also be codeword, symbol pairs, with a third field for the next state (2 or 3), such as (codeword, symbol, next-state). When a matching entry is found in a duplicates table, a second matching entry is also found, but with a different next-state field. The entry with the next-state of 2 is sent as SYM A to register 52 or 56, while the entry with the next-state of 3 is sent as SYM B to register 54 or 58.

Another alternative is to combine the two entries with the same codeword in main duplicates table 72 or substitute duplicates table 76. The codeword is then stored with the two symbols. The symbol with the next-state of 2 is stored in the second field, while the symbol with the next state of 3 is stored in the third field. This simplifies routing of symbols to registers 52, 54, 56, 58 since the second field is always sent to registers 52, 56, and the third field is always sent to registers 54, 58. The entries then do not have to include the next-state fields. The entries in duplicates tables 72, 76 are then codeword, symbol, symbol triads: (codeword, symbol-2, symbol-3), where symbol-2 is the symbol with a next state of 2, while symbol-3 is the symbol with the next state of 3.

When no matching entry is found in any of the tables, a sync pattern may have been detected, or an error has occurred. A separate sync-pattern detector is used to pulse a sync clock when the sync pattern is found. The sync pattern is a violation of the RLL(2,7) code used in the modulation tables and thus never occurs in the data of a sector. Errors frequently occur at higher read speeds and can be corrected later with error correction codes transmitted with the user bytes. The failure of a table lookup can be used to signal that a bit-stream error has occurred.

Entries Reduced by 45% Using Unique and Duplicates Sorting

By sorting the entries from the 8 DVD modulation subtables into unique and duplicates tables, the number of entries can be reduced significantly as repeated entries for different current states are combined. For the main table, the DVD specification shows 256 entries in each of four subtables, for a total of 1024 entries. These 1024 entries are sorted and combined together into just 263 entries in main unique table 70, and 278 entries in main duplicates table 72. Thus the main table is reduced from 1024 entries to 278+263, or 541 entries.

For the substitute table, the DVD specification has 87 entries in each of four subtables, for a total of 348 entries. These entries are sorted into 74 unique entries, and 134 duplicate entries. Thus sorting and combining reduces the number of entries from 348 to 209 entries.

Overall, the 1372 (1024+348) entries in the DVD specification's modulation tables are reduced to 750 (541+209) entries. This is a reduction to 55% of the size of the DVD specification's tables.

When the two matching entries in the duplicates tables are combined into one (codeword, symbol-2, symbol-3) entry, then the number of entries is reduced even further.

Figure 12:
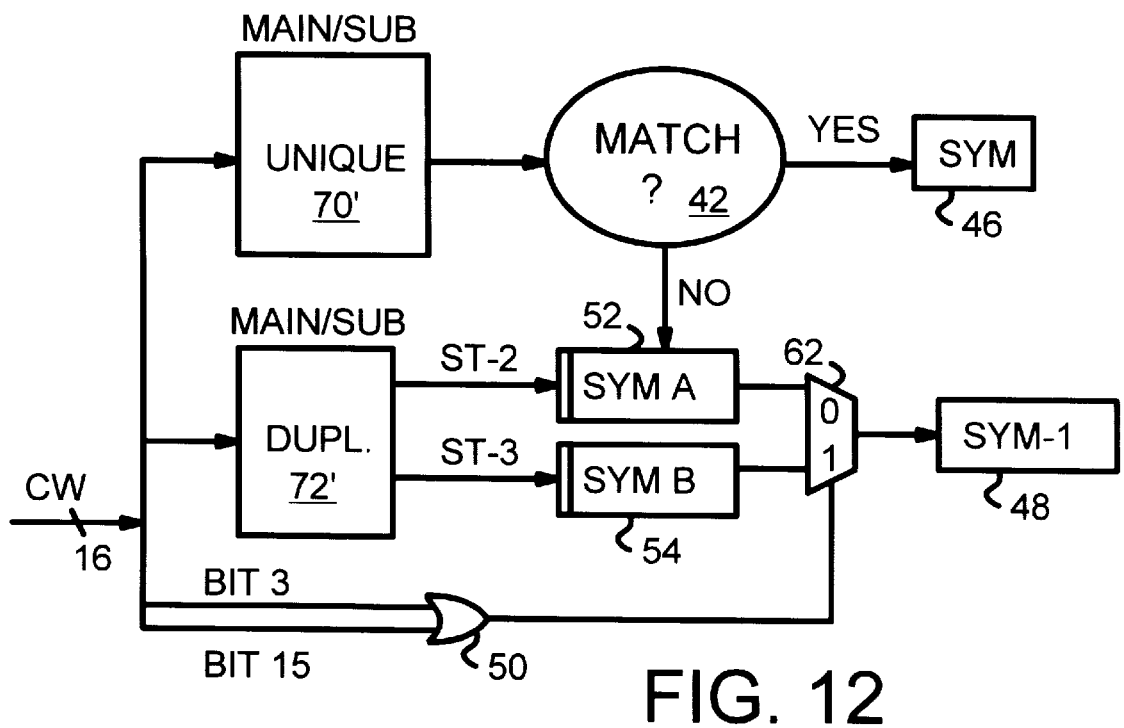
FIG. 12 shows a demodulator with separate unique and duplicates tables, but without separate main and substitute tables.

DeModulator With Combined Main and Substitute Tables—FIG. 12

FIG. 12 shows a demodulator with separate unique and duplicates tables, but without separate main and substitute tables. Since a codeword never has an entry in both main unique table 70 and substitute unique table 74 of FIG. 11, these two tables can be combined into a unified unique table 70'. The 263 entries of main unique table 70 are appended with the 75 entries of substitute unique table 74 to make a table with 263+75 entries. Each entry is a (codeword, symbol) pair. Each of the 338 entries has a different codeword, but several of the entries output the same symbols.

Likewise, main duplicates table 72 and substitute duplicates table 76 of FIG. 11 have no overlapping entries and can be combined. The 278 entries of main duplicates table 72 can be appended with the 134 entries in substitute duplicates table 76 to form unified duplicates table 72' with 278+134 entries.

The input codeword is looked up in unified unique table 70', and when comparator 42 finds a match, the symbol from the matching entry is latched into latch 46 as the demodulated symbol SYM. When comparator 42 finds no match, unified duplicates table 72' is looked up, and symbols from two matching entries are latched into registers 52, 54. The next codeword has its bits 15 and 3 OR'ed by OR gate 50, which selects the correct symbol with mux 62, which is output to register 48 as the previous symbol, SYM-1.

Figure 13:
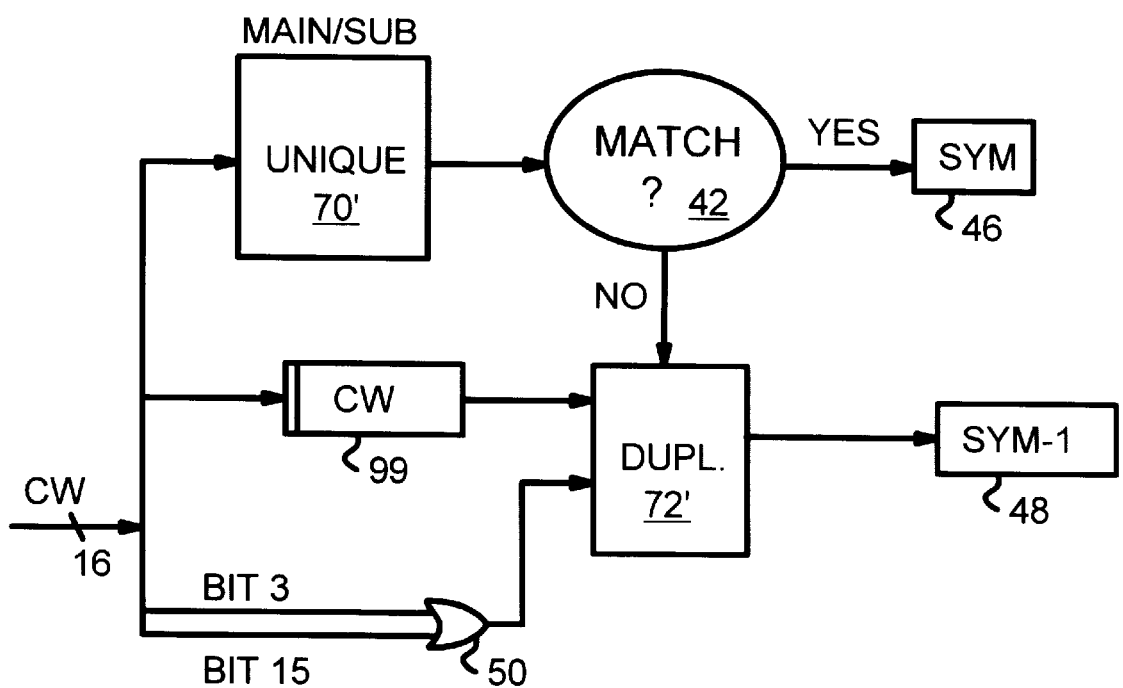
FIG. 13 is a demodulator using pipelined unique and duplicates lookup tables.

Pipelined Demodulator—FIG. 13

FIG. 13 is a demodulator using pipelined unique and duplicates lookup tables. Unified unique table 70' is looked up with the input codeword CW, and comparator 42 finds a match, the symbol from the matching entry is loaded into latch 46.

When comparator 42 does not find a match in the unique table, the input codeword CW is latched into register 99. While the next codeword is being looked up in unified unique table 70', the previous codeword from register 99 is looked up in unified duplicates table 72'. The OR of bits 15 and 3 of the current codeword from OR gate 50 is sent to unified duplicates table 72' as an extra bit in the lookup, which is appended to the 16 bits of the previous codeword from register 99. Note that 16 of the bits are from the previous codeword, while one bit of the lookup is from the current codeword. The extra bit from OR gate 50 is used to select from among the two matching entries, either next-state 2 or next-state 3. The selected symbol is then output to register 48 as the previous symbol, SYM-1.

Advantages of the Invention

Smaller demodulation tables are possible with the invention. The de-modulation process is faster with smaller demodulation tables. Compaction of the modulation tables reduces the number of entries, but without losing accuracy and precision of the conversion. A more streamlined de-modulation of DVD-disk data is achieved. Dependencies of codewords to other codewords in the data stream is reduced since dependencies are only resolved for states 2 and 3, not for states 1 and 4. The state-sequencing information that is stored in the current modulation tables is reduced. The current state information is eliminated entirely, while the next state information is retained only for half of the entries, for entries with next states 2 or 3. In many cases demodulation is performed without state dependency.

Overall, the 1372 (1024+348) entries in the DVD specification's modulation tables are reduced to 750 (541+209) entries. This is a reduction of 55%. Further reductions are possible by combining duplicate entries in the duplicates table, although each entry is larger since it contains two symbols and the codeword. The reduced tables can more easily be implemented in hardware using logic-gate synthesis tools. Using only 2 state rather than 4 state improves lookup speed.

Alternate Embodiments

Several other embodiments are contemplated by the inventor. For example pipelining may be used to read bits from the next codeword while the current codeword is being looked up or processed after lookup. Table lookup itself can take one or many clock cycles. All entries can be combined into one physical table with different logical sections. Other modifications of the tables, registers, and comparators are possible. The pipeline may start out with 1-codeword delay before commencing the demodulation process. Therefore, as the look up occurs of any codeword, the next codeword and state (2,3) is available. This simplifies the datapath further.

A content-addressable memory (CAM) can be used for the lookup tables, where comparators are included within each memory cell. External comparators or combinations of muxes and comparators can be used with standard memories. Rather than use a regular array of memory cells as a table, the table's contents can be input to a software logic-synthesis tool that converts the table into logic gates arranged in a seemingly random fashion. The demodulator could also be implemented in software, although performance may not be sufficient for high-speed optical disks.

Different coding schemes and modifications to the current RLL(2,10) code can be used to store data on the optical disk. The invention can be altered to operate with other coding schemes. Future versions and enhancements of DVD may be used with the invention.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

APPENDIX - TABLES

In the following tables, "-S2" refers to a next-state of 2 while "-S3" refers to a next state of 3.

Duplicate Main Table

"01000001001000000"(0);-S2    "10000001001000001"(1);-S3    "00100001001000000"(2);-S2
"00100000010010000"(3);-S2    "00100000100100000"(4);-S2    "10000001001000000"(4);-S2
"00100000001001000"(5);-S2    "00100000001001001"(6);-S2    "00100000010010001"(7);-S3
"00100000100100001"(8);-S3    "00100001001000001"(9);-S3    "10000000100100001"(11);-S3
"10000000100100000"(12);-S2   "01000000001001001"(14);-S3   "01000000100100000"(18);-S2
"00100010001000000"(23);-S2   "10000000010010000"(23);-S2   "00100001000100000"(24);-S2
"10000000010010001"(24);-S3   "00100000100010000"(25);-S2   "01000000001001000"(25);-S2
"00100000010001000"(26);-S2   "00001000101000000"(27);-S2   "00100000000010000"(28);-S2
"01000000100100001"(28);-S3   "00001000100100000"(29);-S2   "00010000010010000"(30);-S2
"01000001001000001"(30);-S3   "00010000001001000"(31);-S2   "00010000000001000"(32);-S2
"00010000000001001"(33);-S3   "00010000001001001"(34);-S3   "10000000001001000"(34);-S2
"00010000010010001"(35);-S3   "00010000100100001"(36);-S3   "10000000100101001"(36);-S3
"00010001001000001"(37);-S3   "00100000000010001"(38);-S3   "00100000010001001"(39);-S3
"00100000100010001"(40);-S3   "00100001000100001"(41);-S3   "00100010001000001"(42);-S3
"10000100001000000"(42);-S2   "10000100001000001"(44);-S3   "10000001000100000"(48);-S2
"10000000100010000"(49);-S2   "10000000100100001"(50);-S3   "10000000010010000"(63);-S2
"01000000010010000"(64);-S2   "00100100001000000"(65);-S2   "10000100001000000"(65);-S2
"00100010000100000"(66);-S2   "10000010000100000"(66);-S2   "00100001000010000"(67);-S2
"00100000100001000"(68);-S2   "10000001000010000"(68);-S2   "00100000000100000"(69);-S2
"10000000100001000"(69);-S2   "00010000100010000"(70);-S2   "01000010001000000"(70);-S2
"00000010010001001"(70);-S3   "00010010001000000"(71);-S2   "01000000100010000"(71);-S2
"01001000000100001"(71);-S3   "00000010000010001"(71);-S3   "00010000000010000"(72);-S2
"01000001000100000"(72);-S2   "10001001000100001"(72);-S3   "00010001000100000"(73);-S2
"10000000010010001"(73);-S3   "10010000001001000"(73);-S3   "00010000010001000"(74);-S2
"01000000010010001"(74);-S3   "00001001001000000"(75);-S2   "10000100001000001"(75);-S3
"00001000100100000"(76);-S2   "10000010000100001"(76);-S3   "00001000100101000"(77);-S2
"01000000010001000"(77);-S2   "00001000001001000"(78);-S2   "10000001000010001"(78);-S3
"00001000000001000"(79);-S2   "10000001000001001"(79);-S3   "00001000000001001"(80);-S3
"01000000100010001"(80);-S3   "00001000001001001"(81);-S3   "00001000010001001"(82);-S3
"01000000010001001"(82);-S3   "00001000100100001"(83);-S3   "10000001000100001"(83);-S3
"00001001001000001"(84);-S3   "10010010010010000"(84);-S2   "00010000000010001"(85);-S3
"01000001000100001"(85);-S3   "00001000001001001"(86);-S3   "10010010001001000"(86);-S2
"00010000010001001"(87);-S3   "01000010001000001"(87);-S3   "00010001000100001"(88);-S3
"10010010010010001"(88);-S3   "00010010001000001"(89);-S3   "00100000000100001"(90);-S3
"00100000100001001"(91);-S3   "00100001000010001"(92);-S3   "00100010000100001"(93);-S3
"00100100001000001"(94);-S3   "01000100001000000"(97);-S2   "10010010000001000"(98);-S2
"10010010010010001"(99);-S3   "01000010000100000"(106);-S2   "01000100001000001"(114);-S3
"10001001001001000"(119);-S2  "10001001000001000"(120);-S2  "10001000001000000"(122);-S2
"00100100100001000"(123);-S2  "10000100100001000"(123);-S2  "00100100000100000"(124);-S2
"10000100000100000"(124);-S2  "00100010000010000"(125);-S2  "00100010010001000"(126);-S2
"10000010010001000"(126);-S2  "00010001000001000"(127);-S2  "00100001010001000"(128);-S2
"10000010000010000"(128);-S2  "00001000100010000"(129);-S2  "00100001000001000"(130);-S2
"10000001001001000"(130);-S2  "00100000001000000"(131);-S2  "10010010000001001"(131);-S3
"00010010000100000"(132);-S2  "10001001001001001"(132);-S3  "00001000000010000"(133);-S2
"00010000100001000"(134);-S2  "10001000001000001"(134);-S3  "00010000000100000"(135);-S2
"10000100100001001"(135);-S3  "00001001000100000"(136);-S2  "10000100000100001"(136);-S3
"00001000010001000"(137);-S2  "10000010010001001"(137);-S3  "00000100010010000"(138);-S2
"00000100100100000"(139);-S2  "10000010000010001"(139);-S3  "00000100001001000"(140);-S2

APPENDIX - TABLES-continued

"00000100000001000"(141);-S2  "10000001000001000"(141);-S2  "00000100000001001"(142);-S3
"10000001001001001"(142);-S3  "00000100001001001"(143);-S3  "10000001000001001"(143);-S3
"00000100010010001"(144);-S3  "01000000100001000"(144);-S2  "00000100100010001"(145);-S3
"00001000000010001"(146);-S3  "01000000000100000"(146);-S2  "00001000010001001"(147);-S3
"10000000001000000"(147);-S2  "00001000100010001"(148);-S3  "01000000100001001"(148);-S3
"00001001000100001"(149);-S3  "10000000001000001"(149);-S3  "00010000000100001"(150);-S3
"01000010010001001"(150);-S3  "00010000100001001"(151);-S3  "00010010000100001"(152);-S3
"01000010000100001"(152);-S3  "00010010000100001"(153);-S3  "00100000001000001"(154);-S3
"01000001000010000"(154);-S2  "00100001000001001"(155);-S3  "10010001001001001"(155);-S3
"00100001001001001"(156);-S3  "00100010000010001"(157);-S3  "00100010010001001"(158);-S3
"10001001001001001"(158);-S3  "00100100100010001"(159);-S3  "10010010010001000"(159);-S2
"00100100100001001"(160);-S3  "10010010000010000"(160);-S2  "01000000000100001"(161);-S3
"01001001001001000"(162);-S3  "01001001001001001"(163);-S3  "10010001001001000"(165);-S2
"10010001000001000"(166);-S2  "01001001000001000"(167);-S2  "10010010010001001"(168);-S3
"01001000001000001"(171);-S3  "01001000010001000"(181);-S3  "01000100010010001"(184);-S3
"10010000001000000"(185);-S2  "10001001000010000"(186);-S2  "10001000100001000"(187);-S2
"10001000000100000"(189);-S2  "00000010010010000"(190);-S2  "01000100100001000"(190);-S2
"10000100100010000"(190);-S2  "00000010010001000"(191);-S2  "01000100000100000"(191);-S2
"10000100010010001"(191);-S2  "00000010000001000"(192);-S2  "01000010010010001"(192);-S2
"10000100000010000"(192);-S2  "00100100100010000"(193);-S2  "01000100000100001"(193);-S3
"00100100010010000"(194);-S2  "10000010010010000"(194);-S2  "00100100000010000"(195);-S2
"00100010010010000"(196);-S2  "10000010001010000"(196);-S2  "00100010000001000"(197);-S2
"10000010000010000"(197);-S2  "00100010010010000"(198);-S2  "00010010010010000"(199);-S2
"01000100000010000"(199);-S2  "00010001001001000"(200);-S2  "10010000001000001"(200);-S3
"00010010000010000"(201);-S2  "10001001000010001"(201);-S3  "00010010000010000"(202);-S2
"00010000001000000"(203);-S2  "10001001000010001"(203);-S3  "00001000100001000"(204);-S2
"10000100100010001"(204);-S3  "00001000000100000"(205);-S2  "10000100010001001"(205);-S3
"00000100100010000"(206);-S2  "00000100100010000"(207);-S2  "00000100100010000"(208);-S2
"10000100010010001"(208);-S3  "00000100000010000"(209);-S2  "00000010000001001"(210);-S3
"10000100000010001"(210);-S3  "00000010001001001"(211);-S3  "01000001001001000"(211);-S2
"10000100010010001"(211);-S3  "00000010010010001"(212);-S3  "01000001000001000"(212);-S2
"10000100010010001"(212);-S3  "00000100010010001"(213);-S3  "00000100010010001"(214);-S3
"01000010000010001"(214);-S3  "00000100100010001"(215);-S3  "01000000001000000"(215);-S2
"00001000000100001"(216);-S3  "10010010000100001"(216);-S3  "00001000100001001"(217);-S3
"10010001000001001"(217);-S3  "00001001000010001"(218);-S3  "01000001000001001"(218);-S3
"00010000000010001"(219);-S3  "00010001000001001"(220);-S3  "10010010000100001"(220);-S3
"00010001001001001"(221);-S3  "10010001000010000"(221);-S2  "00010010000010001"(222);-S3
"01000001001001001"(222);-S3  "00010010010001001"(223);-S3  "10010010000010001"(223);-S3
"00100010000001001"(224);-S3  "10001000000100001"(224);-S3  "00100010001001001"(225);-S3
"00100010010010001"(226);-S3  "01000010100001001"(226);-S3  "00100100000010001"(227);-S3
"01001001000001001"(227);-S3  "00100100010001001"(228);-S3  "10010001000010001"(228);-S3
"00100100100010001"(229);-S3  "01000000001000001"(229);-S3  "01001000100001000"(232);-S2
"01001000000100000"(233);-S2  "10010000100001001"(239);-S3  "01001000100001001"(240);-S3
"10010000100001000"(241);-S2  "00000010010001000"(254);-S2  "10010000000100000"(254);-S2
"00000010000010000"(255);-S2  "10001001000100000"(255);-S2

Unique Main Table

"0010000000001001"(0);      "0010000000010010"(1);      "1000000000010010"(2);
"0000000001001000"(3);      "0100010010000000"(3);      "1001001000000000"(5);
"1000100100000000"(6);      "0100000000010010"(7);      "1000010010000000"(8);
"1001001000000001"(9);      "0010010010000000"(10);     "1000100100000001"(10);
"0010001001000000"(11);     "0010010010000001"(12);     "0010010001000001"(13);
"1000010010000001"(13);     "0010000010001001"(14);     "0010000100100001"(15);
"1000010001000001"(15);     "0010000010010001"(16);     "1000000100100001"(16);
"0010000000100010"(17);     "1000001001000000"(17);     "0001000000001001"(18);
"0010000000010001"(19);     "1001000100000000"(19);     "0001000000010010"(20);
"1000100010000000"(20);     "0000100000000010"(21);     "1000000010010001"(21);
"0000010000000001"(22);     "1000000001001001"(22);     "1000000000100010"(26);
"1000000000010001"(27);     "1001001000000010"(29);     "1001000010000001"(31);
"1000100100000010"(32);     "1000100010000001"(33);     "0100001001000000"(35);
"1000010001000000"(37);     "0100100010000000"(38);     "1001000010000001"(39);
"0100010010000001"(40);     "1000010010000010"(41);     "0010010001000000"(43);
"1000010001000001"(43);     "0001001001000000"(44);     "0000001000000001"(45);
"0100010001000000"(45);     "1000001001000010"(45);     "0010010010000010"(46);
"1000001000100001"(46);     "0100000001001001"(47);     "0100001001001001"(47);
"0010010001000001"(48);     "0010001001000010"(49);     "0010001000100001"(50);
"0001000001001001"(51);     "0100000100100001"(51);     "0010000100100010"(52);
"1000000100100010"(52);     "0010000100010001"(53);     "1000000100010001"(53);
"0010000010010010"(54);     "1000000010010010"(54);     "0010000001000010"(55);
"1000000010001001"(55);     "0010000000100001"(56);     "1000000010000010"(56);
"0000100000001001"(57);     "0100000010010001"(57);     "0001001001000001"(58);
"1000000000100001"(58);     "0001000100100001"(59);     "0100000001001001"(59);
"0001000010010001"(60);     "1001001000010010"(60);     "0001000000100010"(61);
"1001001000001001"(61);     "0001001000010001"(62);     "1001000000010010"(62);
"0000100000010010"(63);     "0000010000000010"(64);     "0100000000100010"(67);
"1000100001000000"(81);     "1001000010000001"(89);     "1000100100010010"(90);
"1000100100001001"(91);     "0100000000010001"(92);     "1000100010000010"(93);
"1000100001000001"(94);     "0000001000000010"(95);     "0100010100000010"(95);
"1000100010010010"(95);     "0000000100000001"(96);     "0100100010000001"(96);

APPENDIX - TABLES-continued

"1000010010001001"(96); "0010010010001001"(97); "0010010010010010"(98);
"0010010001000010"(99); "0010010000100001"(100); "1000010001000010"(100);
"0010001001001001"(101); "0100010010000010"(101); "0010001001000010"(102);
"1000010000100001"(102); "0010001000100001"(103); "1000001001001001"(103);
"0010000100010010"(104); "1000010001000010"(104); "0010000010000010"(105);
"1000010000010001"(105); "0010000100001001"(106); "0010000001000001"(107);
"1000000100010010"(107); "0001001001000001"(108); "1000001001001001"(108);
"0001001000100001"(109); "1000000010000010"(109); "0001000100100010"(110);
"1000000001000001"(110); "0001000100010001"(111); "0100000010001001"(111);
"0001000010010010"(112); "1001001001001001"(112); "0001000001000010"(113);
"1001001000100010"(113); "0001000001001001"(114); "0001000000100001"(115);
"1001001000010001"(115); "0000100100100001"(116); "1001000100010010"(116);
"0000100010010001"(117); "1001000100001001"(117); "0000100010010001"(118);
"0100010001000001"(118); "0000100000100010"(119); "0000100000010001"(120);
"0000010000001001"(121); "0100001001000010"(121); "0000010000010010"(122);
"0100001000100001"(125); "0100000100010010"(127); "0100000100010001"(129);
"0100000010010010"(133); "0100000001000010"(138); "1001000010000010"(140);
"1001000001000000"(145); "1000000001000000"(151); "1001000001000001"(153);
"1000100100100010"(156); "1000000000100001"(157); "0100010010000000"(158);
"0000001000010010"(161); "1000100100010001"(161); "0000001000001001"(162);
"1000100010010010"(162); "0000000100000010"(163); "1000100010001001"(163);
"0000000010000001"(164); "0100100100010010"(164); "1000100001000010"(164);
"0010010010010001"(165); "0010010000100010"(166); "0010010001001001"(167);
"0010010000010001"(168); "0010010000010010"(169); "1000100000100001"(169);
"0010000100000010"(170); "1000010010010001"(170); "0010001000001001"(171);
"0010000010000001"(172); "1000010001001001"(172); "0001001000100010"(173);
"1000010000100010"(173); "0001001000010001"(174); "1000010000010001"(174);
"0001000100010010"(175); "1000001000010010"(175); "0001000010010010"(176);
"1000001000001001"(176); "0001001001001001"(177); "0100100010000010"(177);
"0001000001000001"(178); "1000000100000010"(178); "0000100100100010"(179);
"1000000010000001"(179); "0000100100010001"(180); "0100100100001001"(180);
"0001000100001001"(181); "0000100010010010"(182); "0100001001001001"(182);
"0000100001000010"(183); "0100001001001001"(183); "0000100010001001"(184);
"0000100000100001"(186); "0000010010010001"(186); "0000010000100010"(187);
"0000010001001001"(188); "0100100001000001"(188); "0000010000010001"(189);
"0100010010010010"(195); "0100010010010010"(198); "0100010001000001"(202);
"0100001000100010"(206); "0100001000010001"(207); "0100000100010010"(209);
"0100000010000010"(210); "0100000001000001"(213); "0100000100001001"(219);
"1001001001000010"(225); "0010000001000000"(230); "1001001000100001"(230);
"0000001001001001"(231); "0100100100100001"(231); "1001001001000010"(231);
"0000001000100010"(232); "1001001001000001"(232); "0000001000010001"(233);
"1001000010010010"(233); "0000000100010010"(234); "0100000001000000"(234);
"1001000010001001"(234); "0000000100001001"(235); "0100100100010001"(235);
"1001000001000010"(235); "0000000010010010"(236); "0100100010010010"(236);
"1001000000100001"(236); "0000000001000001"(237); "0100100001000010"(237);
"1000100100100001"(237); "0010010000010010"(238); "1000100100010010"(238);
"0010001000000010"(239); "0010010000001001"(240); "0010010010000001"(241);
"0010010010000010"(242); "1000000010000000"(242); "0001000100000000"(243);
"1000100001001001"(243); "0001001000001001"(244); "0100100000100001"(244);
"0001000010000001"(245); "1000100000100010"(245); "0000100100010010"(246);
"1000100000010001"(246); "0000100010000010"(247); "1000010000010010"(247);
"0000100100001001"(248); "0100010010010001"(248); "0000100001000001"(249);
"1000010000010001"(249); "0010010010010010"(250); "1000001000000001"(250);
"0000010001000010"(251); "1000000100000001"(251); "0000010010001001"(252);
"0100010000100010"(252); "0000010000100001"(253); "0100100010001001"(253);
"0100010000010001"(254); "0100001000010010"(255);

Substitution Duplication Table

"01001000010010000"(0);-S2 "01001000010010001"(1);-S3 "00000001001000001"(4);-S3
"10010000000001001"(4);-S3 "00000000100100001"(5);-S3 "10010000001001001"(5);-S3
"00000000010010001"(6);-S3 "01001000000001000"(6);-S2 "10010000001001001"(6);-S3
"00000000010010000"(7);-S2 "10010000000001000"(7);-S2 "00000000100100000"(8);-S2
"01001000100100001"(8);-S3 "10010000001001000"(8);-S2 "00000001001000000"(9);-S2
"01001000001001000"(9);-S2 "10010000010010000"(9);-S2 "10001000010010001"(11);-S3
"01000100010010001"(12);-S3 "10010000000001001"(13);-S3 "00000010010000001"(13);-S3
"01001000000001001"(14);-S3 "10010000100100001"(14);-S3 "00000001000100001"(15);-S3
"01001000100100000"(15);-S2 "10010001001000001"(15);-S3 "00000000100010001"(16);-S3
"01001000000010001"(16);-S3 "00000000010001001"(17);-S3 "01001000100010001"(17);-S3
"00000000100001000"(18);-S2 "10010000010001001"(18);-S3 "10010000010001000"(18);-S2
"00000001000010000"(19);-S2 "01001001001000001"(19);-S3 "10010001001000000"(19);-S2
"00000001001000000"(20);-S2 "01001000100010010"(20);-S2 "01001001001000000"(20);-S2
"00000010001000000"(21);-S2 "01001000000010000"(21);-S2 "10001000001001001"(22);-S3
"10001000100100001"(23);-S3 "01001000100001000"(24);-S2 "10001000000001000"(25);-S2
"01000100000001001"(26);-S3 "10001000000001000"(28);-S2 "10001000001001000"(30);-S2
"10001000010010000"(31);-S2 "00000100001000001"(33);-S3 "00000010000100001"(34);-S3
"10010001001000001"(34);-S3 "00000001000010001"(35);-S3 "10010000000010001"(35);-S3
"00000000100001001"(36);-S3 "10010000010001001"(36);-S3 "00000100001000000"(37);-S2
"00000000100001000"(38);-S2 "01000100001001001"(38);-S3 "10001000100100000"(38);-S2
"00000001000010000"(39);-S2 "01000100001001000"(39);-S2 "10001001001000000"(39);-S2

APPENDIX - TABLES-continued

| | | |
|---|---|---|
| "00000010000100000"(40);-S2 | "10010000000010000"(40);-S2 | "10010000010001000"(43);-S2 |
| "10010000100010001"(45);-S3 | "10010001000100001"(46);-S3 | "01000100000010001"(48);-S3 |
| "01001000010001001"(50);-S3 | "01000100100100001"(51);-S3 | "01000100100100000"(52);-S3 |
| "01001000010001000"(53);-S2 | "01001001000100001"(55);-S3 | "10010010001000001"(56);-S3 |
| "10010000100010000"(57);-S2 | "00100100100100001"(58);-S3 | "10010001000100000"(58);-S2 |
| "00100100010010001"(59);-S3 | "01001001000010000"(59);-S2 | "00100100001001001"(60);-S3 |
| "10010010010010000"(60);-S2 | "00100100000001001"(61);-S3 | "01000100010010000"(61);-S2 |
| "00010010010010001"(62);-S3 | "00010010001001001"(63);-S3 | "01000010010010001"(63);-S3 |
| "00010010000001001"(64);-S3 | "01000100100010001"(64);-S3 | "00001001001001001"(65);-S3 |
| "01001001000010001"(65);-S3 | "00001001000001001"(66);-S3 | "10000100000001001"(66);-S3 |
| "00001000000001001"(67);-S3 | "10001000001001001"(67);-S3 | "00000100100001001"(68);-S3 |
| "10000100010010001"(68);-S3 | "00000100000100001"(69);-S3 | "10000100100100001"(69);-S3 |
| "01000010000010000"(70);-S2 | "10001000000010001"(70);-S3 | "10001000100010001"(71);-S3 |
| "00000001001001001"(72);-S3 | "01000100010001001"(72);-S3 | "00000010000001001"(73);-S3 |
| "01000010001001001"(73);-S3 | "00000100000100000"(74);-S2 | "10001000010001001"(74);-S3 |
| "00010010010010000"(75);-S2 | "01000010000001001"(75);-S3 | "00000100100001000"(76);-S2 |
| "01000100000010000"(76);-S2 | "00001000001000000"(77);-S2 | "01000100100010000"(77);-S2 |
| "00100100010010000"(78);-S2 | "00001001000001000"(79);-S2 | "01001001000010000"(79);-S2 |
| "00001001001001000"(80);-S2 | "10001000000001000"(80);-S2 | "00010010000001000"(81);-S2 |
| "10001000001001000"(81);-S2 | "00010010001001000"(82);-S2 | "10001000010010000"(82);-S2 |
| "00100100000001000"(83);-S2 | "10001001100100000"(83);-S2 | "00100100001001000"(84);-S2 |
| "10001000000010000"(84);-S2 | "00100100100100000"(85);-S2 | "00000001000001000"(86);-S2 |
| "01000010001001000"(86);-S2 | "10001000010001000"(86);-S2 | "00000001001001000"(87);-S2 |
| "01000100010001000"(87);-S2 | "10001000100010000"(87);-S2 | |

Substitution Unique Table

| | | |
|---|---|---|
| "0000010010000000"(0); | "0000100100000000"(1); | "0001001000000000"(2); |
| "0100100000010001"(2); | "0000001001000000"(3); | "0100010000000001"(3); |
| "1000001000000000"(3); | "0100100000000010"(4); | "0100001000000000"(5); |
| "0100000100000000"(7); | "0000010001000000"(10); | "1001001001000000"(10); |
| "0000100010000000"(11); | "0001000100000000"(12); | "0010001000000000"(13); |
| "0100001000000001"(16); | "0100010000000010"(17); | "0100100000000010"(21); |
| "0000010010000001"(22); | "0000100100000001"(23); | "0001001000000001"(24); |
| "0010010000000001"(25); | "0000000001001001"(26); | "1000010000000001"(26); |
| "0000000010010001"(27); | "0100000100000001"(27); | "1000100000000010"(27); |
| "0000000100100001"(28); | "1001000000001001"(28); | "0000001001000001"(29); |
| "0100001000000010"(29); | "1001000000010010"(29); | "0000100001000000"(30); |
| "0001000010000000"(31); | "0010000100000000"(32); | "0100010000001001"(32); |
| "0100100001001001"(33); | "0100010000010010"(34); | "0100100000010001"(35); |
| "0100000010000000"(36); | "1000001000000001"(37); | "0100100000100010"(40); |
| "0000010001000001"(41); | "1000010000000010"(41); | "0000010010000010"(42); |
| "1000000100000000"(42); | "0000100010000001"(43); | "0000100100000010"(44); |
| "1000100000001001"(44); | "0001000100000001"(45); | "0001001000000010"(46); |
| "0010010000000001"(47); | "1001000000000010"(47); | "0010010000000010"(48); |
| "0000000001000010"(49); | "0100100010010001"(49); | "1001000000010001"(49); |
| "0000000010010001"(50); | "1001000000100010"(50); | "0000000010010010"(51); |
| "1001000001001001"(51); | "0000000100010001"(52); | "1001000010010001"(52); |
| "0000000100100010"(53); | "1001000100100001"(53); | "0000001001000001"(54); |
| "0100100100100001"(54); | "1001001001000001"(51); | "0000001001000010"(55); |
| "0100001000001001"(55); | "0001000001000000"(56); | "0010000010000000"(57); |
| "0100000010000001"(62); | "0100000100000010"(78); | "0100010001001001"(85); |

I claim:

1. A demodulator comprising:

a codeword input, receiving codewords modulated using a multi-state modulator from original symbols;

a symbol output for outputting demodulated symbols converted from the codewords, wherein the demodulated symbols match the original symbols when no errors occur;

a unique detector, coupled to the codeword input, for determining when an input codeword has a unique mapping to a single symbol, wherein the input codeword is only converted to the single symbol regardless of a state of the multi-state modulator, the unique detector outputting the single symbol as a demodulated symbol to the symbol output;

a duplicated detector, coupled to the codeword input, for determining when the input codeword has a non-unique mapping to a plurality of symbols, wherein the input codeword is converted to a first symbol when the multi-state modulator was in a first state, but converted to a second symbol when the multi-state modulator was in a second state after generating the input codeword, the duplicates detector outputting the first symbol and the second symbol;

a next-codeword decoder, coupled to receive from the codeword input a next codeword that follows the input codeword, the next-codeword decoder reading bits of the next codeword to determine a modulation state; and a multiplexer, coupled to the next-codeword detector and receiving the first symbol and the second symbol from the duplicates detector, for outputting the first symbol as the demodulated symbol to the symbol output when the modulation state from the next-codeword detector is in a first modulation state, but outputting the second symbol as the demodulated symbol to the symbol output when the modulation state from the next-codeword detector is in a second modulation state, whereby codewords are demodulated by detecting when the codeword has the unique mapping or the non-unique mapping.

2. The demodulator of claim 1 wherein the next codeword is in the first modulation state when the multi-state modulator was in the first state when generating the next codeword, and wherein the next codeword is in the second modulation state when the multi-state modulator was in the second state when generating the next codeword.

3. The demodulator of claim 1 wherein the unique detector comprises:

a unique table containing unique entries, the unique entries having a codeword field and a symbol field, the unique detector comparing the input codeword to the codeword field and selecting the symbol field when the codeword field matches the input codeword, the symbol field being output as the demodulated symbol, wherein a table lookup is performed to find the demodulated symbol for the unique mapping.

4. The demodulator of claim 3 wherein the duplicates detector is activated when the unique detector fails to find an entry with a matching codeword.

5. The demodulator of claim 3 wherein the duplicates detector comprises:

a duplicates table containing duplicates entries, the duplicates entries having a codeword field, a symbol field, and a next-state field, the duplicates detector comparing the input codeword to the codeword field and selecting the symbol field when the codeword field matches the input codeword, the symbol field being output as the first symbol when the next-state field indicates the first modulation state, but the symbol field being output as the second symbol when the next-state field indicates the second modulation state, p1 whereby the duplicates table includes next-state information but the unique table contains no state information.

6. The demodulator of claim 5 wherein two entries in the duplicates table have matching codeword fields, one matching entry outputting the first symbol and another matching entry outputting the second symbol, whereby two entries match the input codeword in the duplicates table, but only one entry can match the input codeword in the unique table.

7. The demodulator of claim 5 wherein entries in the unique table have no dependency to other codewords in an input stream of codewords from the codeword input, wherein entries in the duplicates table are dependent on the next codeword in the input stream of codewords from the codeword input, whereby entries are sorted by dependency.

8. The demodulator of claim 5 wherein the unique table comprises a main unique table and a substitute unique table, and wherein the duplicates table comprises a main duplicates table and a substitute duplicates table, whereby main and substitute tables are used for demodulation.

9. The demodulator of claim 5 wherein the multi-state modulator comprises four subtables each having 256 entries in a main table and each also having less than 256 entries in a substitute table, wherein a number of total entries in the unique table and the duplicates table is about half of a total number of entries in the four subtables, whereby the number of entries is reduced by about half.

10. The demodulator of claim 3 wherein the duplicates detector comprises:

a combined-entry duplicates table containing duplicates entries, the duplicates entries having a codeword field, a first-symbol field, and a second-symbol field, the duplicates detector comparing the input codeword to the codeword field and selecting the first-symbol field and the second-symbol field when the codeword field matches the input codeword, the first-symbol field being output as the first symbol and the second-symbol field being output as the second symbol, whereby the combined-entry duplicates table stores both possible symbols.

11. The demodulator of claim 3 wherein the codewords are run-length-limited RLL codewords and wherein a stream of codewords from the codeword input are modulated to minimize voltage excursions during reading of the codewords from a media.

12. The demodulator of claim 11 wherein the codewords are read from a digital-versatile disk (DVD) optical disk.

13. The demodulator of claim 12 wherein the codewords are 16-bit RLL codewords and wherein the symbols are 8-bit bytes of user data or error-correction information, whereby the demodulator is an 8/16 demodulator.

14. A method of demodulating codewords read from an optical disk comprising:

receiving a current codeword from the optical disk;

looking up the current codeword in a unique table for a matching entry for the current codeword;

outputting a demodulated symbol from the matching entry when the matching entry is found;

when the matching entry is not found in the unique table:

looking up the current codeword in a duplicates table outputting from the duplicates table a first possible symbol and a second possible symbol from the matching entry when the matching entry is found;

waiting for a next codeword from the optical disk, the next codeword following the current codeword in a data stream read from the optical disk;

decoding the next codeword to generate a state signal;

selecting as the demodulated symbol either the first possible symbol or the second possible symbol from the matching entry in the duplicates table in response to the state signal from decoding of the next codeword; and replacing the codeword with the demodulated symbol in a data stream to a host, whereby the demodulated symbol is read from the unique table or selected from one of two possible symbols read from the duplicates table.

15. The method of claim 14 wherein looking up the current codeword in the unique table comprises:

comparing codeword fields in entries for codewords with a unique mapping to one symbol, wherein the unique mapping is independent of a sequence of codewords from the optical disk; and wherein looking up the current codeword in the duplicates table comprises:

comparing codeword fields in entries for codewords with a duplicates mapping to two symbols, wherein the duplicates mapping is dependent on the sequence of codewords from the optical disk, whereby entries are sorted by sequence dependency.

16. The method of claim 15 wherein looking up the current codeword in the unique table comprises:

comparing codeword entries in a main unique table and in a substitute unique table, whereby main and substitute tables are used.

17. The method of claim 15 wherein decoding the next codeword to generate a state signal comprises:

combining two bits of the next codeword with a logical-OR to generate the state signal.

18. A converter for converting codewords to symbols comprising:

unique means, receiving a current codeword, for determining when the current codeword has a unique conversion to a unique symbol wherein the current codeword is never converted to other symbols, the unique means outputting the unique symbol when the current codeword has a unique conversion;

duplicate means, receiving the current codeword, for outputting a first possible symbol and a second possible symbol when he current codeword does not have a unique conversion but instead the current codeword is converted to either the first possible symbol or the second possible symbol depending on a sequence of codewords that includes the current codeword;

dependency means, receiving a next codeword following the current codeword, for decoding the next codeword to determine a dependency state;

select means, responsive to the dependency state from the dependency means, for selecting the first possible symbol or the second possible symbol in response to the dependency state, the select means outputting a selected symbol;

data stream means, coupled to the select means and to the unique means, for outputting the unique symbol as a converted symbol to replace the current codeword when the current codeword has a unique conversion, but outputting the selected symbol as the converted symbol when the current codeword does not have the unique conversion, whereby codewords are converted to symbols based on unique or non-unique conversions.

19. The converter of claim 18 wherein the codewords are 16-bit run-length-limited (RLL) codes of physical data and wherein the symbols are bytes of binary data.

20. The converter of claim 18 wherein the codewords are read from a digital-versatile disk (DVD) optical disk from pits in the optical disk formed in a pattern of the 16-bit run-length-limited (RLL) codes.

* * * * *